(12) United States Patent
Peng et al.

(10) Patent No.: US 7,480,171 B2
(45) Date of Patent: Jan. 20, 2009

(54) MRAM BASED ON VERTICAL CURRENT WRITING AND ITS CONTROL METHOD

(75) Inventors: Zilong Peng, Beijing (CN); Xiufeng Han, Beijing (CN); Sufen Zhao, Beijing (CN); Weining Wang, Beijing (CN); Wenshan Zhan, Beijing (CN)

(73) Assignee: Institute of Physics Chinese Academy of Science, Beijing (CN)

( * ) Notice: Subject to any disclaimer, the term of this patent is extended or adjusted under 35 U.S.C. 154(b) by 0 days.

(21) Appl. No.: 10/599,514

(22) PCT Filed: Dec. 1, 2004

(86) PCT No.: PCT/CN2004/001385

§ 371 (c)(1),
(2), (4) Date: Dec. 15, 2006

(87) PCT Pub. No.: WO2005/096312

PCT Pub. Date: Oct. 13, 2005

(65) Prior Publication Data

US 2007/0183186 A1    Aug. 9, 2007

(30) Foreign Application Priority Data

Apr. 1, 2004    (CN) .................. 2004 1 0030729

(51) Int. Cl.
*G11C 7/00* (2006.01)
(52) U.S. Cl. ..................... 365/158; 365/173
(58) Field of Classification Search .......... 365/158, 365/173
See application file for complete search history.

(56) References Cited

U.S. PATENT DOCUMENTS

| 6,430,085 | B1 * | 8/2002 | Rizzo ................ 365/173 |
| 6,632,517 | B1 * | 10/2003 | Tang et al. .......... 428/811.4 |
| 6,791,792 | B2 * | 9/2004 | Takahashi ............ 360/112 |
| 6,791,868 | B2 * | 9/2004 | Gider et al. .......... 365/158 |
| 6,956,766 | B2 * | 10/2005 | Nakamura et al. ....... 365/171 |
| 7,068,537 | B2 * | 6/2006 | Hiebert et al. ........ 365/171 |
| 2004/0052127 | A1 * | 3/2004 | Suzuki et al. ......... 365/200 |
| 2004/0082082 | A1 * | 4/2004 | Li et al. .............. 438/3 |
| 2004/0114443 | A1 * | 6/2004 | Ezaki et al. .......... 365/200 |
| 2004/0130936 | A1 * | 7/2004 | Nguyen et al. ......... 365/158 |
| 2004/0165320 | A1 * | 8/2004 | Carey et al. .......... 360/324.11 |
| 2004/0165425 | A1 * | 8/2004 | Nakamura et al. ....... 365/171 |
| 2004/0246776 | A1 * | 12/2004 | Covington ............ 365/173 |
| 2005/0052902 | A1 * | 3/2005 | Smith et al. .......... 365/158 |
| 2005/0106810 | A1 * | 5/2005 | Pakala et al. ......... 438/257 |
| 2006/0171196 | A1 * | 8/2006 | Freitag et al. ........ 365/158 |

FOREIGN PATENT DOCUMENTS

| CN | 1385905 | 12/2002 |
| CN | 1433022 | 7/2003 |

* cited by examiner

*Primary Examiner*—Michael T Tran
(74) *Attorney, Agent, or Firm*—Lucas & Mercanti, LLP

(57) ABSTRACT

The invention discloses a MRAM (Magnetoresistive RAM) based on vertical current writing and its control method, the operation of information writing in the MRAM unit is completed by the corporate effect of the magnetic field generated by the current parallel to the MFC unit and the other current vertical to the MFC unit and passing through this unit. The advantage of such structure is: eliminating a word line (WL) of the prior art especially for information writing, reducing the number of the metal wiring layers and the contact holes, and reducing the complexity of MRAM's structure, and difficulty and cost of manufacturing process.

11 Claims, 5 Drawing Sheets

Fig. 1 (the prior art)

MRAM BASED ON VERTICAL CURRENT WRITING AND ITS CONTROL METHOD

TECHNICAL FIELD

Memory cells in an RAM (Random Access Memory) can be constituted by magnetoresistive effect multilayered film developed recently, this kind of RAM is the so-called magnetoresistive RAM which is abbreviated as MRAM. The present invention relates to a new method for implementing information writing in the MRAM.

BACKGROUND OF THE INVENTION

1. MFC (Magnetic Film Cell) in MRAM

As a memory cell in MRAM, the magnetic film contains at least such a film structure as [F1/NF/F2], in which F1 and F2 represent two magnetic material layers and NF represents a nonmagnetic material layer interposed between the F1 layer and F2 layer. There is one and only one layer of the F1 and F2, the magnetization direction of which is fixed by a certain layer or layers of external materials (referred to as a nailed layer), thus can not vary as desired under the effect of a small external magnetic field; whereas the other layer is a soft magnetic layer, the magnetization direction of which can vary under the effect of a small external magnetic field (referred to as a free layer). The thickness of the nonmagnetic material layer is very thin which is typically between 0.5 nm and 3.0 nm. Taking such a magnetic film as a memory cell, when the magnetization directions of F1 and F2 are identical, the magnetic film cell MFC shows a low resistance state, and when the magnetization directions of F1 and F2 are opposite, the magnetic film cell MFC shows a high resistance state.

Therefore, the magnetic film cell MFC has two stable resistance states. By changing the magnetization direction of the free layer with respect to the nailed layer in the magnetic film cell MFC, the magnetic film cell MFC can be made to record information. By detecting the resistance state of the magnetic film cell MFC, the information stored therein can be obtained.

2. Typical MRAM Unit Structure

The structure of a commonly used magnetic film cell MFC is shown in FIG. 1. The MRAM structure is configured on a semiconductor substrate and needs totally 3 metal wiring layers M1, M2, M3 and a transitional metal layer TM. Except a read word line RWL, its ground line GND, write word line WWL and bit line BL are located in different metal wiring layers, respectively. The magnetic film cell MFC is connected to the drain region of a transistor ATR through the transitional metal layer TM, the metal wiring layers M2 and M1 as well as pertinent contact holes. The source region of the transistor ATR is connected with the ground line GND, and the gate of the transistor ATR is also the read word line RWL simultaneously.

The writing of information in the magnetic film cell MFC is completed by the cooperation of the bit line BL and the write word line WWL. When writing operation current pass through the bit line BL and the write word line WWL in a certain sequential relation, the corporate magnetic field of the magnetic fields generated by the both currents will make the magnetization direction of the free layer in the magnetic film cell MFC reverse to a certain direction, and the magnetization direction can be stabled on one desired state of its two stable states after canceling the currents of the bit line BL and the write word line WWL. Thus, the writing and storing of information in the magnetic film cell MFC is implemented.

The reading of the information in the magnetic film cell MFC is controlled by the read word line RWL. When the reading is enabled, the read word line RWL is controlled onto an appropriate level to make the transistor ATR to turn on. At this time, there exists an electronic closed circuit from the bit BL (metal wiring layer M3) to the ground line GND through the magnetic film cell MFC, the transitional metal layer TM, a contact hole, the metal wiring layer M2, a contact hole, the metal wiring layer M1, a contact hole, the drain region of the transistor ATR and the source region of the transistor ATR. Therefore, when an appropriate current is provided by the bit line BL, the current resistance state of the magnetic film cell MFC can be extracted. Thus, the reading of information in the magnetic film cell MFC is implemented.

As mentioned above, the MRAM with this kind of structure needs up to 3 metal wiring layers and a transitional metal layer to form its electronic connection, which makes the manufacturing process of the MRAM complicated and its cost high. In addition, before manufacturing the magnetic film cell MFC, the processing operations such as deposition, wiring, punching, insulating medium filling and covering up, and etc. have been experienced on the substrate many times, which makes the smoothness of the surface of the manufacturing face of the magnetic film cell MFC relatively poor, so a special surface polishing processing (such as CMP, Chemical-Mechanical Polishing) should be conducted so as to meet special requirement of the magnetic film cell for the smoothness of the substrate surface. This is also an issue increasing processing difficulty and manufacturing cost.

SUMMARY OF THE INVENTION

In order to solve the above mentioned technical problem, an object of the invention is to provide a control method of an MRAM based on vertical current writing. The invention further provides an access memory based on the control method according to the invention.

In order to achieve the above mentioned object, a control method of an MRAM based on vertical current writing according to the present invention is particularly that the writing operation of information in a magnetic film cell MFC of the MRAM is implemented by a corporate effect of magnetic fields generated by a current parallel to the MFC unit and another current vertical to the MFC unit and passing through this unit.

An MRAM for implementing the control method of the above MRAM comprises: a memory read/write control unit array composed of transistor ATR units, the read/write control unit array being integrated in a semiconductor substrate; a memory cell array composed of a magnetic film cell MFC; a transitional metal layer, the magnetic film cell MFC being connected to the transistor ATR units through the transitional metal layer; and a word line WL and a bit line BL, the word line WL being also a gate of the transistor ATR, and the bit line BL being configured on the magnetic film cell MFC, being vertical to the word line WL, being directly connected with the magnetic film cell MFC, and being vertical to an easy magnetization direction of the magnetic film cell MFC. One or more current-limiting mechanisms are arranged on each bit line BL of the MRAM array, the effect of which is to limit the maximum current capable of passing through a closed circuit on which it is located.

Another MRAM for implementing the control method of the above mentioned MRAM comprises: a memory read/write control unit array composed of transistor ATR units, the read/write control unit array being integrated in a semiconductor substrate; a memory cell array composed of a magnetic film cell MFC; a transitional metal layer, the magnetic film cell MFC being connected to the transistor ATR units through the transitional metal layer; and a word line WL and two bit lines BL1 and BL2, the word line WL being also a gate of the transistor ATR, the two bit lines BL1 and BL2 being configured on the MFC, the bit line BL1 being vertical to the word line WL, and being vertical to an easy magnetization direction of the magnetic film cell MFC, and the bit line BL2 being directly connected with the magnetic film cell MFC, and being isolated from the bit line BL1 by an insulation layer.

A third MRAM for implementing the control method of the above MRAM comprises: a memory read/write control unit array composed of transistor ATR units, the read/write control unit array being integrated in a semiconductor substrate; a memory cell array composed of a magnetic film cell MFC; contact holes and a transitional metal layer, the magnetic film cell MFC being connected to the transistor ATR units through the contact holes and the transitional metal layer; and two word lines WL1 and WL2 and a bit line BL, the word line WL1 being also a gate of the transistor ATR, the word line WL2 and the bit line BL being arranged on the magnetic film cell MFC, the bit line BL and the word line WL2 being vertical to each other and being vertical to an easy magnetization direction of the magnetic film cell MFC, and the word line WL2 being directly connected with the magnetic film cell MFC, and being isolated from the bit line BL by an insulation layer.

By adopting a new vertical current writing method, the invention eliminates a word line especially for information writing in the prior art, reduces the number of the metal wiring layers and the contact holes, and greatly reduces the complexity of MRAM's structure, and difficulty and cost of manufacturing process.

DETAILED DESCRIPTION OF THE PREFERRED EMBODIMENT

The present invention will be further described in detail hereinafter in conjunction with the drawings and best modes for carrying out the invention.

A Method for Vertical Current Writing in the MRAM:

The prior art writing operation in MRAM is completed by coordination of two currents parallel to a memory cell plane, in which one current is parallel to an easy magnetization axis of the memory cell, and another current is vertical to it. In the magnetic field generated by the above two currents. The magnetic field on a difficult magnetization axis of the memory cell provides a reversion magnetic field strength in appropriate size, and the magnetic field in the direction of the easy magnetization axis implements the selection for a reversion direction of a magnetization vector of the memory cell. The present invention provides a new writing method, in which a magnetic field in an easy magnetization direction of the memory cell generated by a current parallel to a plane of a memory cell provides a reversion magnetic field strength in appropriate size, and a circular magnetic field in the plane of the memory cell generated by a current vertical to the plane of the memory cell and passing through the memory cell implements the selection for a reversion direction of a magnetization vector. The new writing method provided by the present invention will be further described hereinafter through specific embodiments.

Embodiment 1

Figure 1:
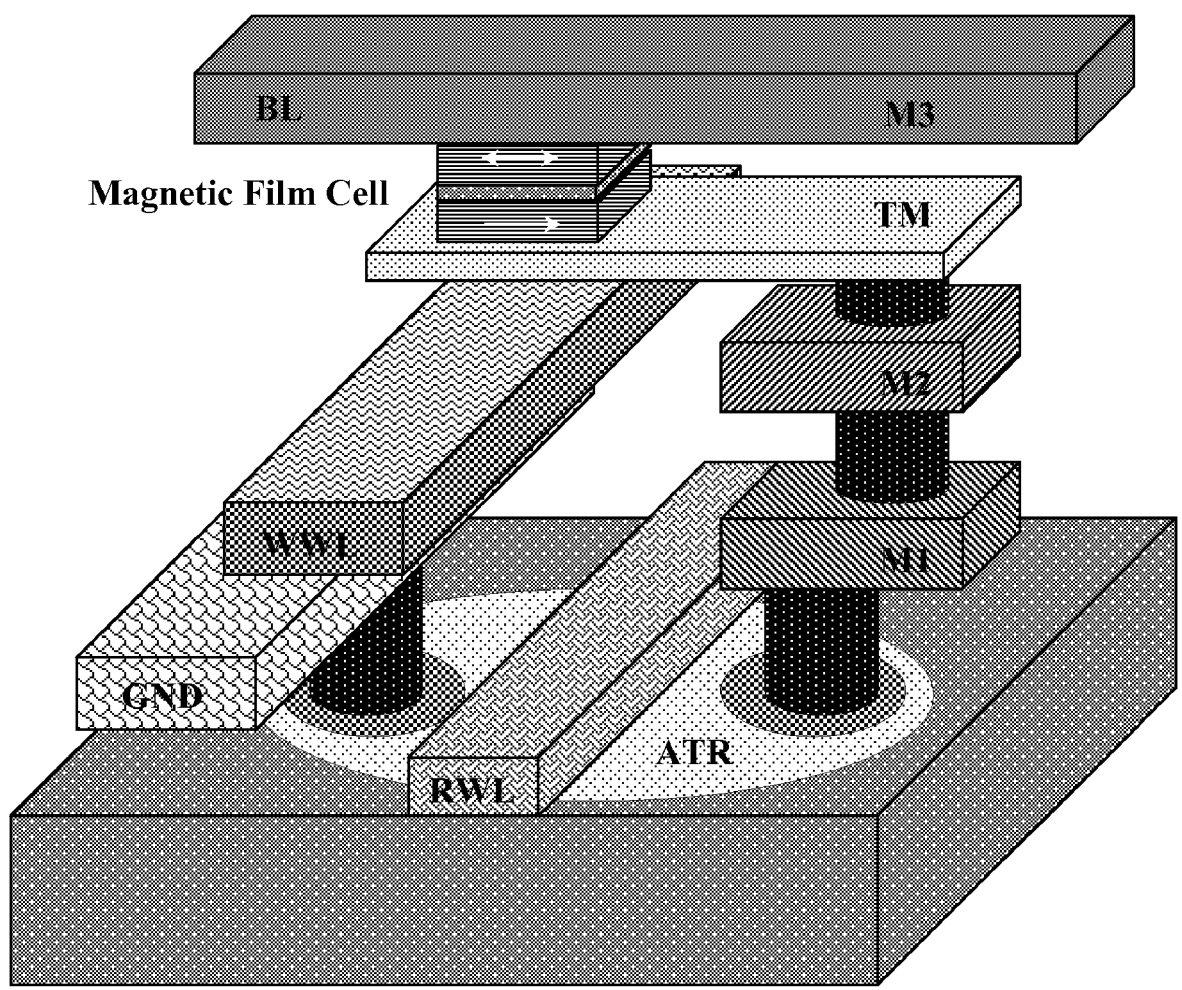
FIG. 1 is a three-dimensional schematic diagram of a structure of an prior art MRAM unit.
Figure 2:
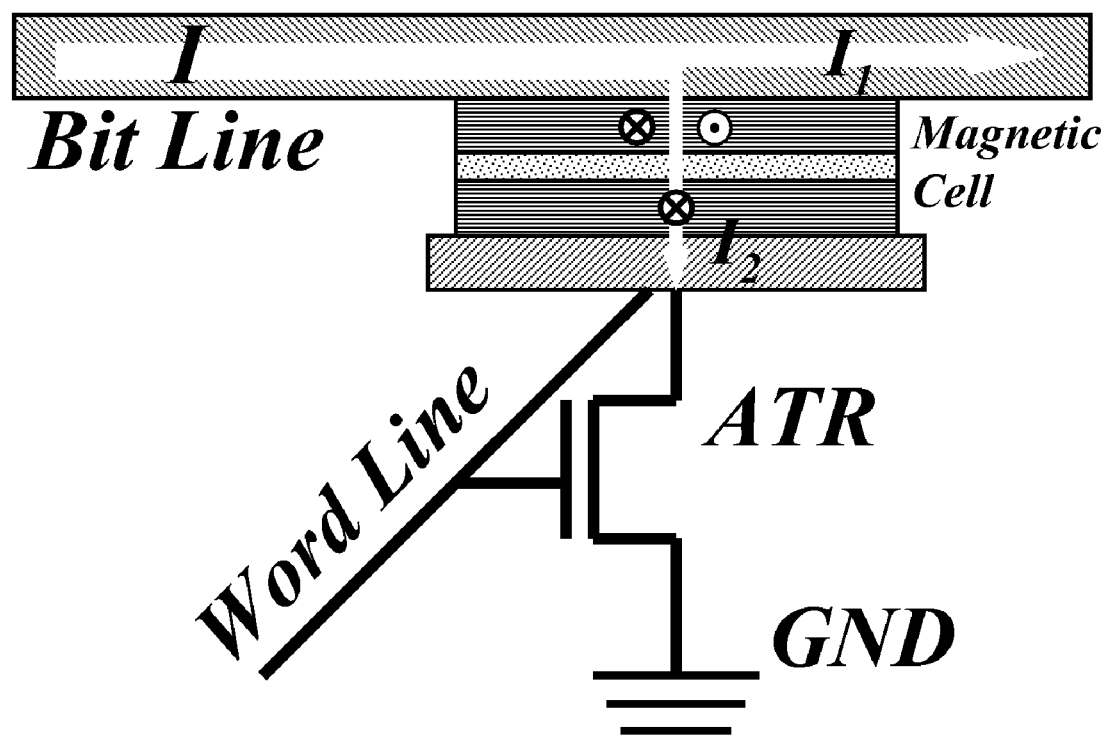
FIG. 2 is a schematic diagram of a structure of an MRAM unit according to an MRAM embodiment 1 based on a vertical current writing method of the present invention.
Figure 3:
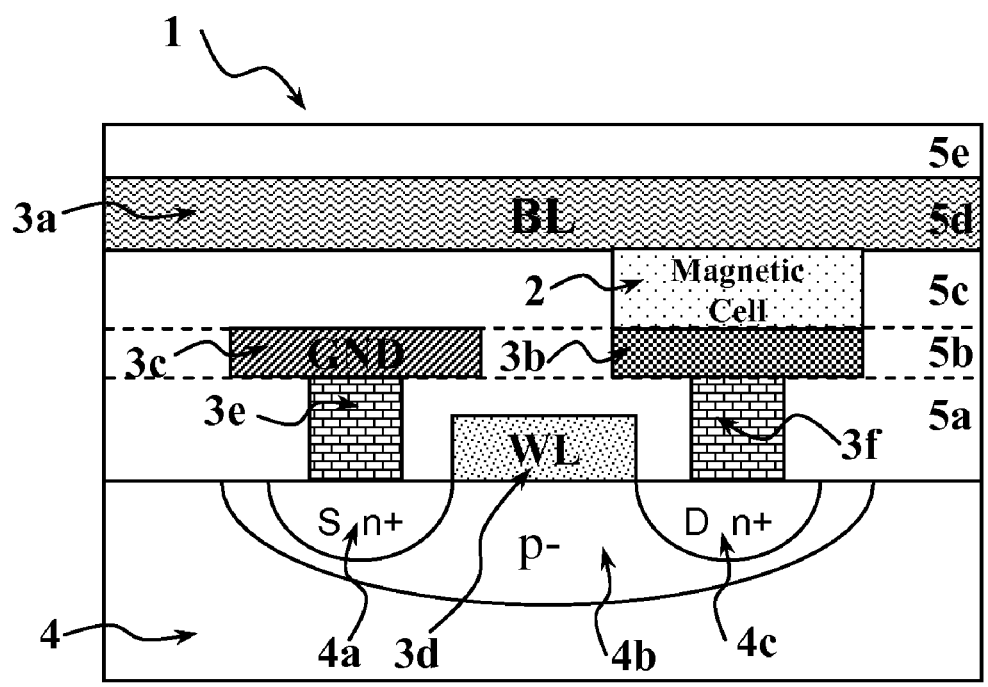
FIG. 3 is a first sectional view of the structure of the MRAM unit according to the embodiment 1 of the present invention.

As shown in FIGS. 2 and 3, a magnetic film cell MFC array in an MRAM memory is constituted by combining a huge number of MRAM units 1, and one MRAM unit 1 comprises a magnetic film cell MFC 2, a transistor ATR 4, a transitional metal layer 3b, contact holes 3e and 3f and a set of wrings, i.e., a bit line BL 3a, a word line WL 3d and ground line GND 3c. The magnetic film cell MFC 2 is connected with the transistor ATR 4 through the transitional metal layer 3b. In the layout, the bit line BL 3a is arranged above on the magnetic film cell MFC 2 and connected directly to the magnetic film cell MFC 2, meantime being vertical to an easy magnetization direction of the magnetic film cell MFC 2.

As shown in FIG. 3, a whole MRAM unit is composed of several layers 5a, 5b, 5c, 5d and 5e. Non-functional regions of these layers are filled and covered up by insulation medium. In the MRAM unit 1, there are only two metal wiring layers 5b and 5d, i.e., layer 5d where the bit line BL 3a locates and layer 5b where the ground line GND 3c and the transitional metal layer 3b locate. The magnetic film cell MFC 2 is arranged under the bit line BL 3a and its upper electrode is connected directly to the bit line BL 3a. The lower electrode of the magnetic film cell MFC 2 is connected to the drain 4c of the transistor ATR 4 through the transitional metal layer 3b and the contact hole 3f. The easy magnetization axis of a free layer in the magnetic film cell MFC 2 is vertical to the long edge direction of the bit line BL 3a.

Figure 4:
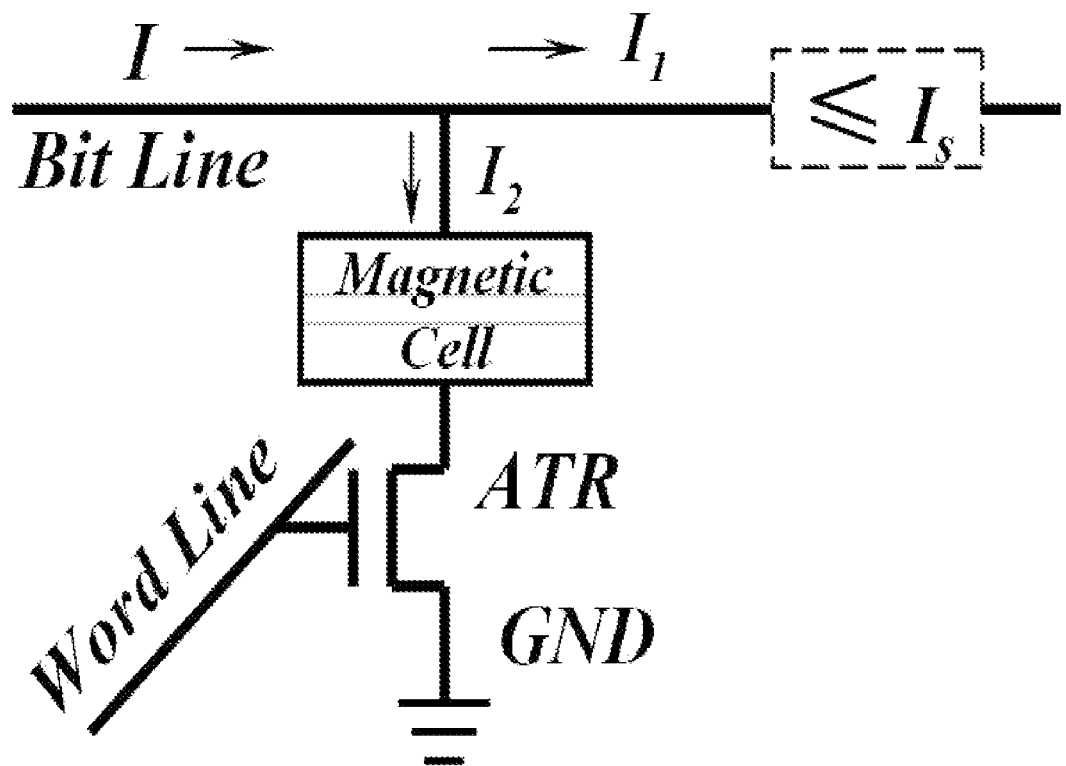
FIG. 4 is a whole schematic diagram of the MRAM unit structure appended with a bit line current-limiting mechanism according to the embodiment 1 of the present invention.
Figure 5:
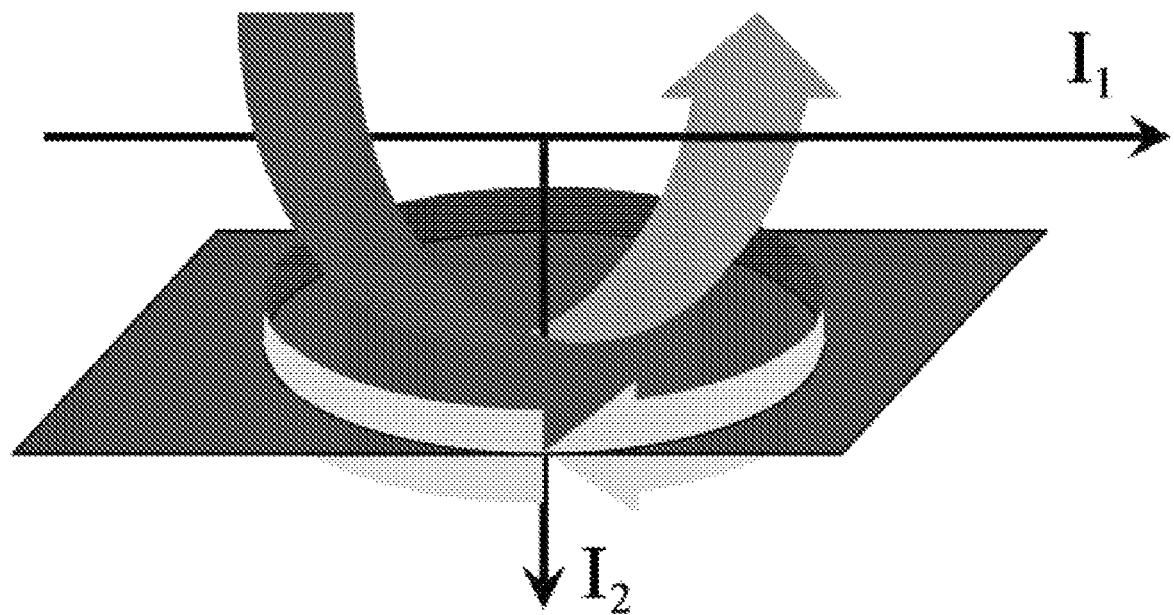
FIG. 5 is a schematic diagram of a space magnetic field generated by a vertical writing current and a parallel writing current in a magnetic film cell MFC according to the present invention.

In order to enable an appropriate part of a current on the bit line BL 3a to flow to a closed circuit from the magnetic film cell MFC 2 to the ground GND 3c during a writing operation, one or more current-limiting mechanisms need to be arranged on each bit line BL of the MRAM array. FIG. 4 is a schematic diagram of arranging a current-limiting mechanism. Thus when the current on the bit line BL is less than the limiting current of the current-limiting mechanism, i.e., $I \leq I_S$, almost all the current pass through the bit line BL and there is no branch current flowing through the magnetic film cell MFC. The specific size of the $I_S$ is determined by the magnetization reversion characteristic parameters of the magnetic film cell MFC, and the magnetic field generated by the current with a size of $I_S$ can not be made to result in the magnetization reversion of the magnetic film cell MFC. When $I \leq I_s$, under the effect of the current-limiting mechanism, it is made $I_1=I_S$ and $I_1+I_2=I$, at this time there exist two currents $I_1$ and $I_2$ which are vertica to each other, the former one being parallel to the surface of the magnetic film cell MFC and the latter one being vertical to the surface of the magnetic film cell MFC. The magnetic fields generated by these currents $I_1$ and $I_2$ in the free layer of the magnetic film cell MFC is shown in FIG. 5 (the distribution of $I_2$ takes the distribution of a point current as an example). The magnetic field generated by current $I_1$ is in the easy magnetization axis direction of the magnetic film cell MFC, and the magnetic field generated by the current $I_2$ is a circular magnetic field within the free layer surface of the magnetic film cell MFC. As can be known from the description in the part of the background art, under the effect of such a corporate magnetic field, the magnetization reversion of the magnetic film cell MFC, i.e., the writing of information in the MRAM can be implemented. At this time, $I_2=I-_1=I-I_s$, its size is also determined by the magnetization reversion characteristic parameters of the magnetic film cell MFC, and the corporate magnetic field generated by the currents with sizes of $I_S$ and $I_2$ can be made to result in the magnetization reversion of the magnetic film cell MFC. For a driving current external to the MRAM array, there is only one writing current of the MRAM of the embodiment, i.e., $I=I_s+I_2$.

Thus, taking the units shown in FIGS. 2 and 3 as examples, in an addressing and reading operation of the MRAM, firstly a selected word line WL 3d is given an appropriate level to enable the transistor ATR 4 to be "ON" state, then a read current is introduced into the selected bit line BL 3a so that a read current flows from the bit line BL 3a to the ground line GND 3c through the magnetic film cell MFC 2, the transitional metal layer 3b, the contact hole 3f, the drain 4c of the transistor ATR 4, the source 4a of the transistor ATR and the contact hole 3e, thus obtaining the current resistance state of the magnetic film cell MFC 2, i.e. the data stored in the MRAM unit 1. In an addressing and writing operation, firstly also the selected word line WL 3d is given an appropriate level to enable the transistor ATR 4 to be "ON" state, then a write current is introduced into the bit line BL 3a. Under the effect of the current-limiting mechanism, the write current is divided into a branch current $I_1$ parallel to the selected magnetic film cell MFC 2 and a branch current $I_2$ vertical to the selected magnetic film cell MFC 2 and passing through the magnetic film cell MFC 2 to GND 3c. A corporate magnetic field generated by them will result in magnetization reversion of the magnetic film cell MFC, i.e., implement the writing of the data.

The current-limiting mechanism on the bit line BL can be arranged and integrated in a peripheral circuit of the MRAM array, and it can have a function of unidirectional current limiting and be composed by diodes and transistors.

Embodiment 2

Figure 6:
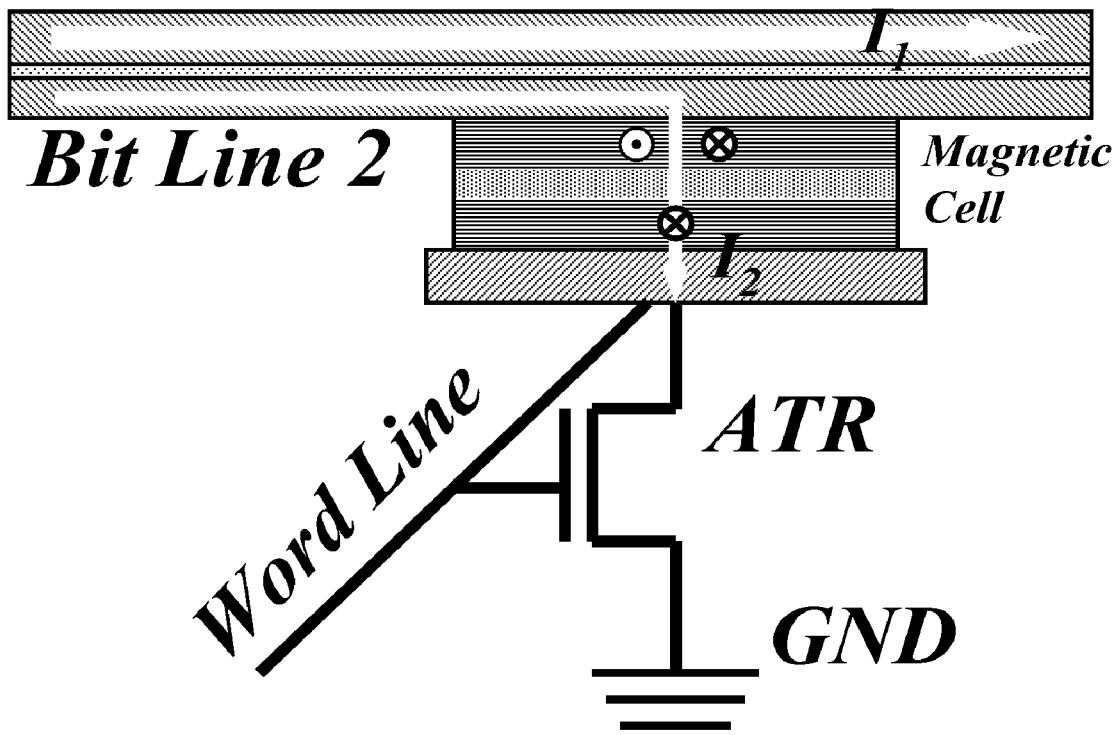
FIG. 6 is a schematic diagram of a structure of an MRAM unit according to an MRAM embodiment 2 based on a vertical current writing method of the present invention.
Figure 7:
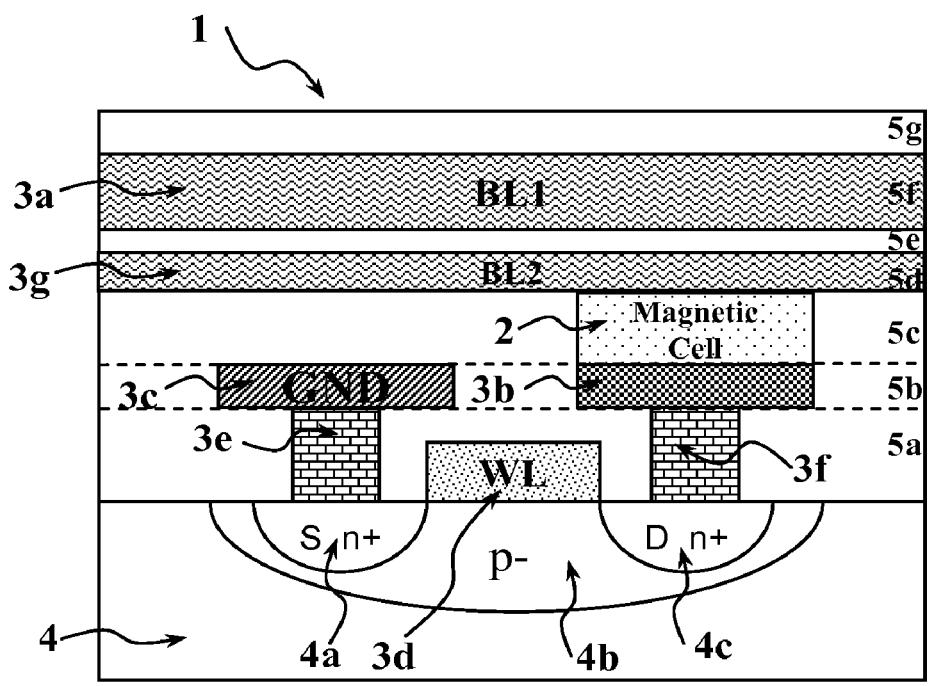
FIG. 7 is a first sectional view of the structure of the MRAM unit according to the embodiment 1 of the present invention.

As shown in FIGS. 6 and 7, an MRAM unit 1 comprises a magnetic film cell MFC 2, a transistor ATR 4, a transitional metal layer 3b, contact holes 3e and 3f and a set of wrings, i.e., a bit line BL1 3a, a bit line BL2 3g, a word line WL 3d and ground line GND 3c. The magnetic film cell MFC 2 is connected with the transistor ATR 4 through the transitional metal layer 3b. In the layout, the bit lines BL1 3a and BL2 3g are arranged above on the magnetic film cell MFC 2 and the bit line BL2 3g is connected directly to the magnetic film cell MFC 2, meantime being vertical to an easy magnetization axis direction of the magnetic film cell MFC 2. The bit line BL 1 3a is isolated from the bit line BL2 3g by insulation layer 5e and are parallel to each other.

As shown in FIG. 7, the whole MRAM unit 1 is composed of several layers 5a, 5b, 5c, 5d, 5e, 5f and 5g. Non-functional regions of these layers are filled and covered up by insulation medium. In the MRAM unit 1, there are three metal wiring layers 5b, 5d and 5f, i.e., layer 5f where the bit line BL 1 3a locates, layer 5d where the bit line BL2 3g locates and layer 5b where the ground line GND 3c and the transitional metal layer 3b locate. The magnetic film cell MFC 2 is arranged under the bit line BL1 3a and BL2 3g and its upper electrode is connected directly to the bit line BL2 3g. The lower electrode of the magnetic film cell MFC 2 is connected to the drain 4c of the transistor ATR 4 through the transitional metal layer 3b and the contact hole 3f. The easy magnetization direction of a free layer in the magnetic film cell MFC 2 is vertical to the long edge direction of the bit line BL1 3a and the bit line BL2 3g. The bit line BL1 3a and the bit line BL2 3g are parallel to each other.

In an addressing and reading operation of the embodiment, firstly a selected word line WL 3d is given an appropriate level to enable the transistor ATR 4 to be "ON" state, then a read current is introduced into the selected bit line BL2 3g so that a read current flows from the bit line BL2 3g to the ground line GND 3c through the magnetic film cell MFC 2, the transitional metal layer 3b, the contact hole 3f, the drain 4c of the transistor ATR, the source 4a of the transistor ATR and the contact hole 3e, thus obtaining the current resistance state of the magnetic film cell MFC 2, i.e. the data stored in the MRAM unit 1. In an addressing and writing operation, firstly also the selected word line WL 3d is given an appropriate level to enable the transistor ATR 4 to be "ON" state, then respective write currents are introduced into the bit lines BLI 3a and BL2 3g in a certain time sequence. The current on the bit line BLI 3a is parallel to the selected magnetic film cell MFC 2, and the current on the bit line BL2 3g will flow through the selected magnetic film cell MFC 2 to GND 3c. A corporate magnetic field generated by them will result in magnetization reversion of the magnetic film cell MFC 2, i.e., implement the writing of the data.

An Alternative to the Embodiment 2

Figure 8:
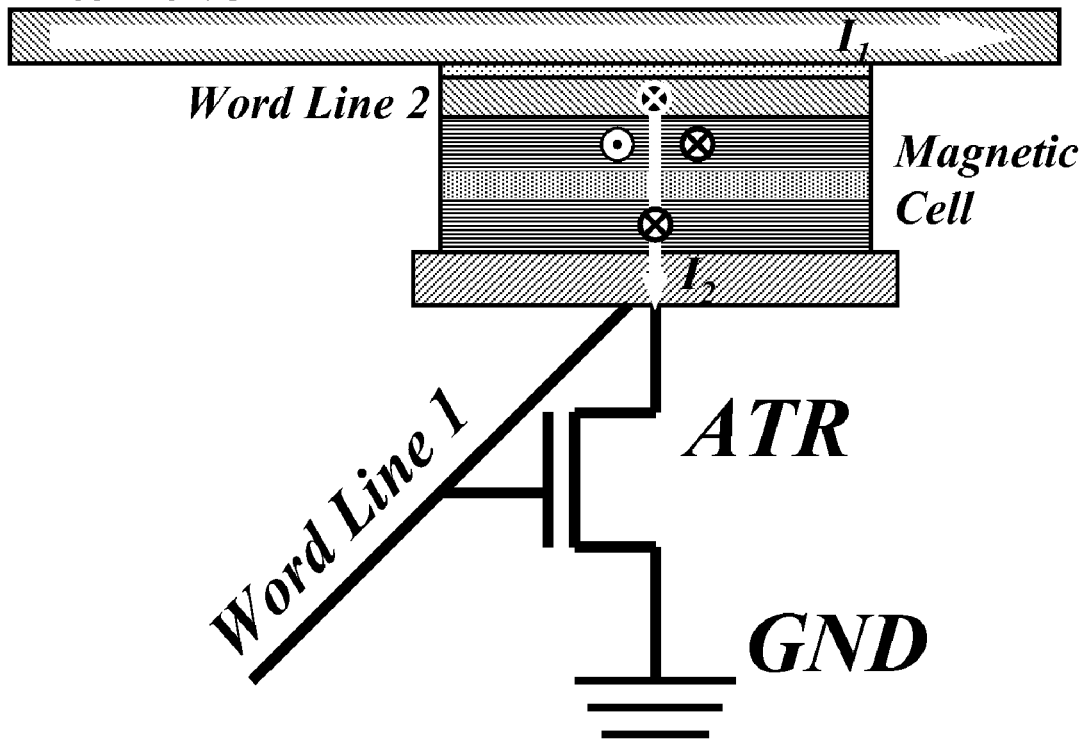
FIG. 8 is a schematic diagram of the MRAM unit structure according to an alternative of the embodiment 2 based on a vertical current writing method of the present invention.
Figure 9:
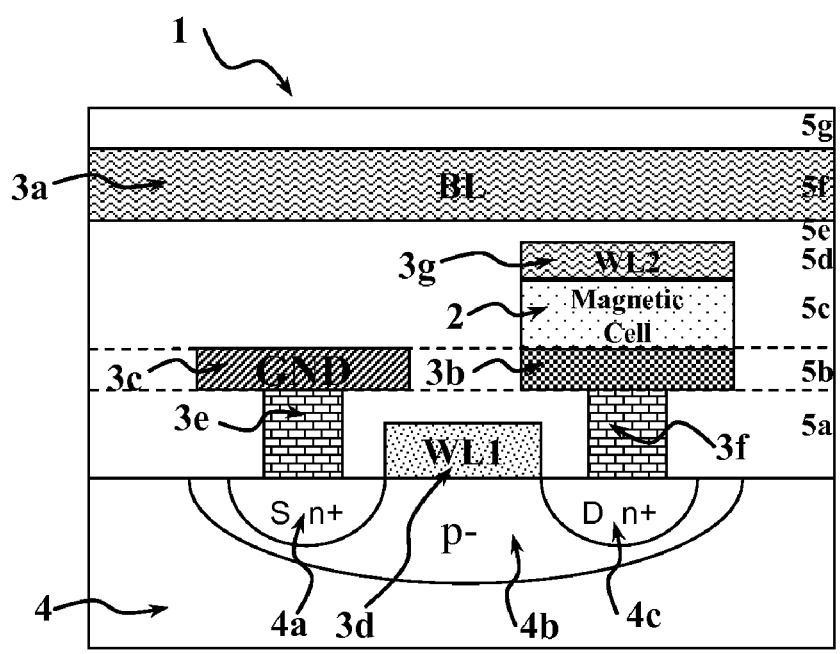
FIG. 9 is first sectional view of the structure of the MRAM unit according to the alternative of the embodiment 2 of the present invention.

As shown in FIGS. 8 and 9, the present alternative embodiment changes the direction of the bit line BL2 3g in the embodiment 2 from being parallel to the bit line BLI 3a to being parallel to the word line WL 3d, which is named word line WL2 in this embodiment, and meantime the original word line is named to WL1 for distinction. The structures of the other parts are basically consistent with those in the embodiment 2, which will not be described further herein.

In an addressing and reading operation of this alternative embodiment, firstly a selected word line WL1 3d is given an appropriate level to enable the transistor ATR 4 to be "ON" state, then a read current is introduced into the selected word line WL2 3g so that a read current flows from the word line WL2 3g to the ground line GND 3c through the magnetic film cell MFC 2, the transitional metal layer 3b, the contact hole 3f, the drain 4c of the transistor ATR, the source 4a of the transistor ATR and the contact hole 3e, thus obtaining the current resistance state of the magnetic film cell MFC 2, i.e. the data stored in the MRAM unit 1. In an addressing and writing operation, firstly also the selected word line WL1 3d is given an appropriate level to enable the transistor ATR 4 to be "ON" state, then respective write currents are introduced into the bit line BL 3a and the word line WL2 3g in a certain time sequence. The current on the bit line BL 3a is parallel to the selected magnetic film cell MFC 2, and the current on the word line WL2 3g will flow through the selected magnetic film cell MFC 2 to GND 3c. A corporate magnetic field generated by them will result in magnetization reversion of the magnetic film cell MFC 2, i.e., implement the writing of the data.

We claim:

1. A control method of an MRAM (Magnetoresistive Random Access Memory) based on vertical current writing, wherein the writing operation of information in a magnetic film cell MFC of the MRAM is implemented by corporate effect of a current parallel to a surface of the MFC and vertical to an easy magnetization direction of the surface of the MFC and a part of said current being branched vertical to the surface of the MFC and passing through the MFC.

2. An MRAM based on vertical current writing, comprising:
   a) a memory control unit array composed of transistor ATR (4) units, the control unit array being integrated in a semiconductor substrate;
   b) a memory cell array composed of a magnetic film cell MFC (2);
   c) contact holes (3e, 3f) and a transitional metal layer, the magnetic film cell MFC (2) being connected to the transistor ATR (4) units through the transitional metal layer and the contact holes (3e, 3f); and
   d) a word line WL (3d) and a bit line BL (3a), wherein the bit line BL (3a) being arranged above on the magnetic film cell MFC (2), directly connected with the magnetic film cell MFC (2), and vertical to an easy magnetization direction of the magnetic film cell MFC (2) along a surface of the MFC, wherein the writing operation of the information of the magnetic film cell MFC (2) is implemented by corporate effect of a current parallel to the surface of the MFC (2) in the bit line BL (3a) and a current branched from the bit line BL (3a) vertical to the surface of the MFC and passing through the MFC.

3. The MRAM based on vertical current writing according to claim 2, wherein one or more current-limiting mechanisms are connected to each bit line EL and are arranged in a peripheral circuit of the MRAM array.

4. The MEAN based on vertical current writing according to claim 3, wherein the basic structure of the magnetic film cell MFC (2) is constituted by two magnetic material layers and a nonmagnetic material layer interposed between the two magnetic material layers, and stored information is represented and stored by the magnetization state of one of the magnetic material layers.

5. The MRAM based on vertical current writing according to claim 4, wherein the bit line BL (3a) and the word line WL (3d) are vertical to each other.

6. The MRAM based on the vertical current writing according to claim 5, wherein the word line BL (3d) also acts as the gate of the transistor ATR (4) unit.

7. The MRAM based on vertical current writing according to claim 6, wherein, in the process of reading information, the transistor ATR (4) is turned on and a read current is introduced from the bit line BL (3a) so as to obtain the information stored in the magnetic film cell MFC (2).

8. The MEAN based on the vertical current writing according to claim 2, wherein there are altogether two internal metal wiring layers, i.e., a layer (5d) where the bit line BL (3a) locates and a layer (5b) where the transitional metal layer (3b) and the ground line GND (3c) locate.

9. The MRAM based on vertical current writing according to claim 3, wherein said current-limiting mechanism can be constituted by a diode and/or a transistor.

10. A control method of an MRAM (Magnetoresistive Random Access Memory) based on vertical current writing, wherein, during a writing operation, a part of a current on a bit line flowing parallel to a surface of a magnetic film cell MFC of the MRAM is branched to flow vertically through the MFC; and
   wherein the writing operation in the MFC is implemented by a corporate effect of the current flowing parallel to the surface of the MFC and the current flowing vertically through the MFC.

11. An MRAM based on vertical current writing, comprising:
   a) a memory control unit array composed of transistor ATR units, the control unit array being integrated in a semiconductor substrate;
   b) a memory cell array composed of a magnetic film cell MFC;
   c) contact holes and a transitional metal layer, the magnetic film cell MFC being connected to the transistor ATR units through the transitional metal layer and the contact holes; and
   d) a word line WL and a bit line BL, where the bit line BL being arranged above on the magnetic film cell MFC, directly connected with the magnetic film cell MFC; and
   e) a current-limiting mechanism comprising diodes and transistors on the bit line BL being arranged and integrated in a peripheral circuit of the MRAM array, where the current-limiting mechanism branches out a part of a current on the bit line EL to flow vertically through the MFC.

* * * * *